United States Patent
Giannetti et al.

[11] Patent Number: 5,520,976
[45] Date of Patent: May 28, 1996

[54] COMPOSITE ENCLOSURE FOR ELECTRONIC HARDWARE

[75] Inventors: William B. Giannetti, Fall River, Mass.; David G. Hess, Atkinson, N.H.; Stuart J. McCord, Westford, Mass.; Robert E. Rudd, III, Vergennes, Vt.; Wei-Tei Shih, Yorba Linda, Calif.

[73] Assignee: Simmonds Precision Products Inc., Akron, Ohio

[21] Appl. No.: 258,174

[22] Filed: Jun. 16, 1994

Related U.S. Application Data

[63] Continuation-in-part of Ser. No. 86,273, Jun. 30, 1993.
[51] Int. Cl.⁶ ...................................................... B32B 9/00
[52] U.S. Cl. .................. 428/36.3; 428/225; 428/167; 174/35 MS; 264/105; 336/84 C; 361/816; 361/831; 439/485
[58] Field of Search .................. 428/36.3, 225; 174/35 MS; 264/105; 336/84 C

[56] References Cited

U.S. PATENT DOCUMENTS

| | | | |
|---|---|---|---|
| H526 | 9/1988 | Miller | 361/424 |
| 3,219,747 | 11/1965 | McAdams | 174/35 |
| 3,992,653 | 11/1976 | Richardson et al. | 317/100 |
| 4,004,194 | 1/1977 | Doerflinger et al. | 317/100 |
| 4,227,037 | 10/1980 | Layton | 174/35 |
| 4,530,949 | 7/1985 | Atkinson et al. | 523/512 |
| 4,608,453 | 8/1986 | Freeman | 174/35 |
| 4,731,698 | 3/1988 | Millot et al. | 361/386 |
| 4,775,260 | 10/1988 | Keemer | 403/409 |
| 4,785,136 | 11/1988 | Mollet et al. | 174/35 |
| 4,791,236 | 12/1988 | Klein et al. | 174/36 |
| 5,016,141 | 5/1991 | Lorig et al. | 361/415 |
| 5,035,942 | 7/1991 | Nagata et al. | 428/288 |
| 5,115,104 | 5/1992 | Bunyan | 174/35 |
| 5,136,119 | 8/1992 | Leyland | 174/35 |
| 5,217,770 | 6/1993 | Morris, Jr. et al. | 428/36.3 |

FOREIGN PATENT DOCUMENTS 2042809  9/1980  United Kingdom.

OTHER PUBLICATIONS

Donegan, Thermal Connection For Circuit Package, IBM Technical Disclosure Bulletin, vol. 13, No. 7, Dec. 1970.
JP 61-029161, Patent Abstract of Japan, "Thermal conductive Cooling Module Device", Feb. 1986.
JP 62-029151, Patent Abstract of Japan, "Cooling Module For Semiconductor Device", Feb., 1987.
European Search Report for EP 94 30 4799 mailed May 29, 1995.

(List continued on next page.)

*Primary Examiner*—Patrick J. Ryan
*Assistant Examiner*—Kam F. Lee
*Attorney, Agent, or Firm*—William C. Tritt; Richard A. Romanchik

[57] ABSTRACT

The present invention contemplates a significant departure from known shielded enclosure designs by providing an enclosure for electronic modules, comprising walls made of composite material including conductive fibers for shielding the enclosure interior from electromagnetic radiation, and means for securely mounting at least one module inside the enclosure with a fastener means, the mounting means comprising composite material. The present invention further contemplates methods for making shielded enclosures and card guides for such enclosures that represent a significant improvement over known enclosure designs. This invention contemplates composite cold walls and composite fins. These composite fins and cold walls may be used alone or together in structures and enclosures which are useful in conducting heat.

24 Claims, 4 Drawing Sheets

OTHER PUBLICATIONS

Camloc Products Division, P.C. Board Fasteners, Selector Guide. Camloc fastener technology sets new standards for P.C. board access, pp. E–1 —E–3.

Glatz et al, Application of Advanced Composites in Sem–E heatsinks for the Thermal Management of Avionics, 5th International SAMPE Electronics Conference, Jun. 18–20, 1991, pp. 451–467.

Runnacles et al, Heat Treatment of Mesophase Pitch Based Low/Intermediate Modulus Fibers for C–C Applications, pp. 33–53 (1992).

Morgan, Applications of Composite Material Systems to Avionic Systems Packaging, (1991).

Riley, Composite Heat Transfer Materials for Electronic Packaging in Future Dod Systems, pp. 2–M–1 —2–M–14, (1991).

Riley/Kesapradist, Advanced Composites Tailored For Use In Electronic Packaging, Conference date Feb. 3, 1992, (1992).

Glatz et al, Application of Resin and Metal Matrix Composites to Advanced Avionics Enclosure, 5th International SAMPE Electronics Conference, Jun. 18–20, 1991, pp. 434–450.

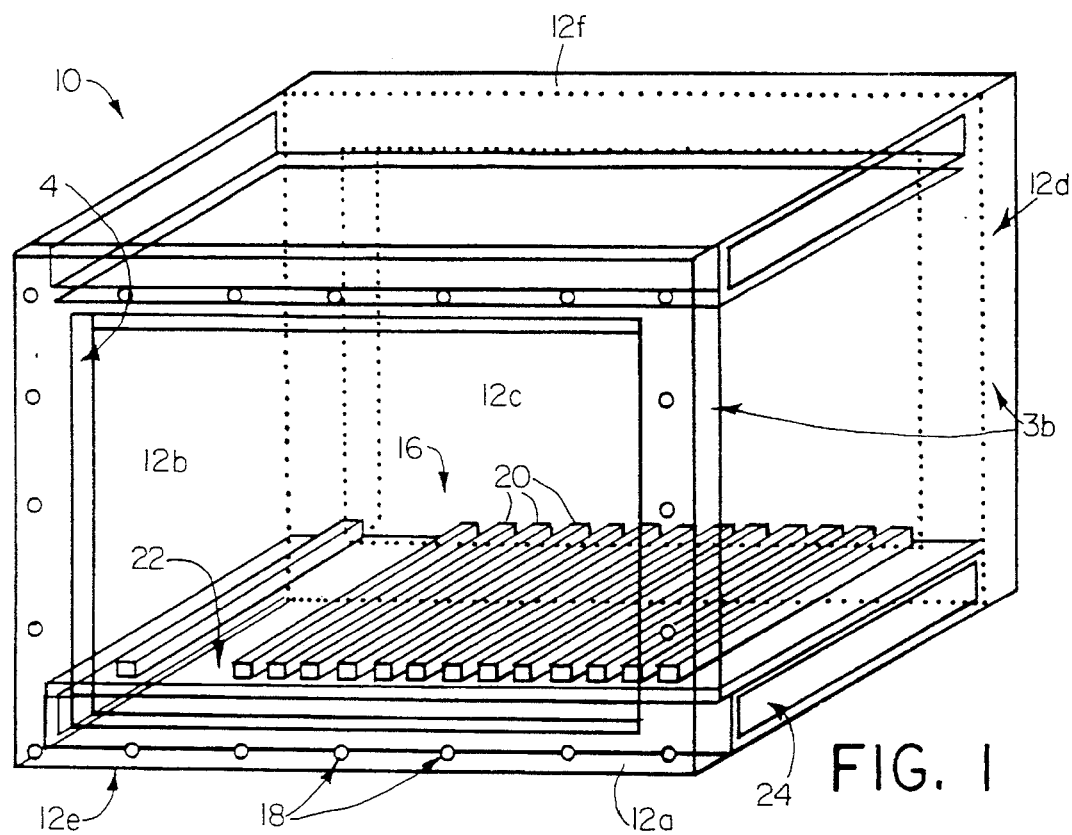
FIG. 1
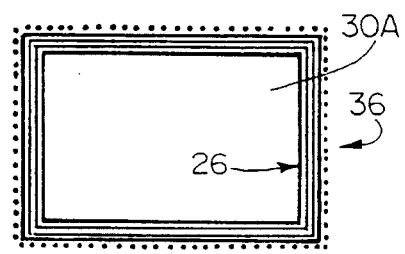
FIG. 1B
FIG. 1A
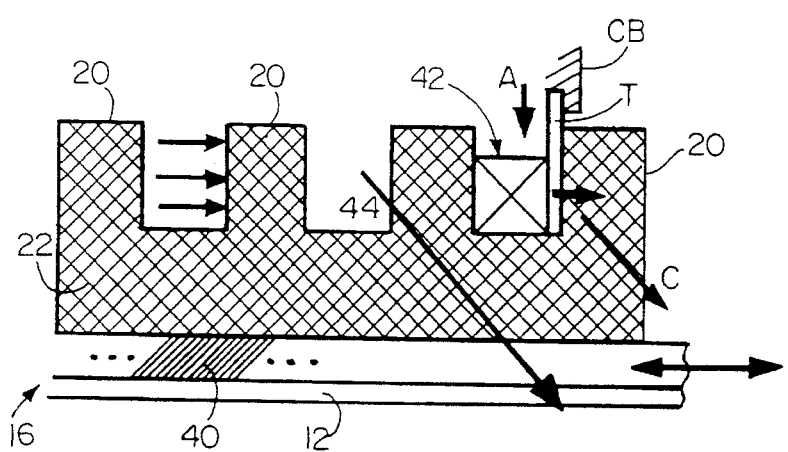
FIG. 2

COMPOSITE ENCLOSURE FOR ELECTRONIC HARDWARE

CROSS REFERENCE TO RELATED APPLICATIONS

This application is a continuation-in-part of copending U.S. Ser. No. 08/086,273 filed Jun. 30, 1993, pending.

FIELD OF THE INVENTION

This invention relates to cold walls, fins, and enclosures for electronic modules where these materials comprise a composite which is a matrix and conductive fiber.

BACKGROUND OF THE INVENTION

The invention relates generally to enclosures for electronic hardware. More particularly, the invention relates to enclosures made of composite materials and that provide electromagnetic shielding for electronic hardware installed in such enclosures.

As is well known, electronic equipment and hardware is susceptible to electromagnetic interference (EMI), whether it be generated from radio waves, interference from nearby equipment, meteorological disturbances and so forth. In applications such as avionics, both military and commercial, such interference can present an unacceptable risk to proper operation of the hardware. Therefore, enclosures for sensitive hardware usually provide for EMI shielding, and in fact such shielding is often necessitated by military and commercial specifications.

Although enclosures made of metal such as aluminum provide good shielding against EMI, such materials add significantly to the weight of the equipment. Composite materials hold great promise for replacing heavier metal materials for enclosures with lightweight but comparably strong materials. Shielding with such composite materials can be accomplished by the use of conductive fibers in the composite material used to form the walls of the enclosure.

Although the general concept of using composite materials for shielded enclosures is well known, their use to date has been limited because of some associated problems. Although composite materials can exhibit excellent structural characteristics, in order to achieve sufficient strength, stiffness and vibrational requirements a trade off is made as to weight. In other words, the weight savings is not necessarily as great as expected due to the need for additional material in order to meet structural integrity requirements. Composite materials that meet the structural requirements also tend to be very expensive, thus substantially increasing the cost of enclosures made of such materials beyond the cost of conventional metal enclosures.

Most enclosures for electronics hardware include a card guide and heat exchanger mounted therein. The card guide, of course, is used to hold one or more electronics modules, and typically includes a plurality of guide ribs that support the modules, and a cold wall that the ribs are attached to. An electronic module typically includes one or more printed circuit boards mounted on a thermally conductive substrate (thermal plane) such as a flat metal sheet or plate. The module is held in the card guide by a suitable clamping device that clamps or wedges the module against one or more of the ribs.

Because a shielded enclosure is tightly sealed from the external environment, heat dissipated from the electronic components must be extracted from the enclosure. Typically, this is accomplished by the card guide, which is metal, and the heat exchanger. Heat is transferred from the circuit boards, through the thermal plane and clamping device to the card guide. The heat exchanger is usually in good thermal contact with the card guide and draws the heat therefrom and transfers it to actively cooled heat transfer fins, and thereafter to the outside region of the enclosure.

Although metal card guides provide good thermal dissipation, their thermal characteristics are not expected to be adequate for future specifications that will require higher heat dissipation in ever smaller enclosures. Electronics manufacturers continually improve their ability to miniaturize and densely pack electronic components into smaller envelopes, thus constantly pushing the performance requirements for dissipating heat from the enclosures. Metal card guides and enclosures will likely not meet these requirements in the future, and in any event will always have an undesirable weight factor, even when the basic enclosure walls are made of composite material.

The need exists, therefore, for a shielded enclosure that exhibits as good as or better structural performance as a conventional enclosure, and that exhibits substantially improved thermal transfer characteristics, while at the same time maintaining weight and cost advantages over known shielded enclosures.

U.S. Statutory Invention Record H526 relates to non-metallic chassis structure with electromagnetic field attenuating capability. This record refers to an electronic equipment chassis structure using non-metallic plastic material such as epoxy-impregnated fiberglass together with layers of shielding metal film, preferably of copper overlaid with nickel.

SUMMARY OF THE INVENTION

The present invention contemplates a significant departure from known shielded enclosure designs by providing an enclosure for electronic modules, comprising walls made of composite material including conductive fibers for shielding the enclosure interior from electromagnetic radiation, and means for securely mounting at least one module inside the enclosure with a fastener means, the mounting means comprising composite material. The present invention further contemplates methods for making shielded enclosures and card guides for such enclosures that represent a significant improvement over known enclosure designs. This invention contemplates composite cold walls and composite fins. These composite fins and cold walls may be used alone or together in structures and enclosures which are useful in conducting heat.

These and other aspects and advantages of the present invention will be readily understood and appreciated by those skilled in the art from the following detailed description of the preferred embodiments with the best mode contemplated for practicing the invention in view of the accompanying drawings.

BRIEF DESCRIPTION OF THE DRAWINGS

FIG. 1 illustrates in perspective a simplified schematic of a shielded enclosure according to the present invention;

FIG. 1A shows an enlarged view in cross-section of a wall construction used with the enclosure depicted in FIG. 1;

FIG. 1B shows an enlarged view, in cross-section, of a stiffening member that may be used with the enclosure of FIG. 1;

FIG. 2 is an end view in elevation of a card guide suitable for use with the invention, shown in a representative manner an electronic module secured therein with a clamping mechanism.

DETAILED DESCRIPTION OF THE INVENTION

Figure 3A:
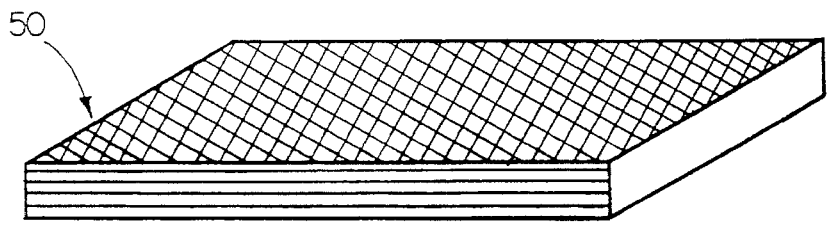
FIGS. 3A through 3E illustrate part of a method for making a composite card guide according to the present invention.

With reference to the drawings, the present invention will be described herein as embodied in the form of shielded a enclosure, a composite cold wall, a composite fin, and structure containing the same for electronic hardware or modules, such as, for example, standard electronics modules used in commercial and military avionics. This description, however, is but one example of many types of enclosures, cold walls, and fins and, uses of such enclosures, cold walls, and fins that embody the concepts of the invention and should not be construed in a limiting sense. The improvements and advantages of the invention can be realized through many different configurations and applications of enclosures for use with electronic hardware.

A shielded enclosure 10 that embodies the concepts of the invention is illustrated in FIG. 1. The enclosure is defined by a plurality of walls 12, including side walls 12a–12d, a bottom wall 12e and a top wall 12f. At least one of the walls, in this case the front wall 12a, is provided with an access opening 14 through which one or more electronic modules (not shown) can be installed in a card guide 16. As will be explained in greater detail with respect to FIG. 6, a cover or door (not shown) is used to close the access opening 14. The door can be attached to the wall 12a with fasteners that thread into holes 18. An access opening in the rear wall 12c or other walls can also be provided if desired.

The card guide 16 actually consists of substantially identical top and bottom guides, but for clarity only the bottom guide is shown in FIG. 1 (the top guide would be attached to the top wall 12f.) The guide 16 includes a plurality of generally parallel guide ribs 20 that are integral with or securely attached to a cold wall 22. Below the cold wall is a plenum 24 that receives a heat exchanger such as a series of cooling fins that are attached to the cold wall. Air or other cooling medium is forced through the plenum 24 over the heat exchanger to extract heat therefrom. The top wall 12f is also provided with a plenum 26 that receives a second heat exchanger that is attached to the cold wall of the top card guide (not shown.)

In a conventional enclosure, the cold wall and guide ribs are made of isotropic metal, such as aluminum, with good thermal conductivity to the heat exchanger. According to an important aspect of the present invention, the card guide 16, including the guide ribs and cold wall 22 are formed of composite material, in this case preferably a carbon resin material. The composite material exhibits better thermal conductivity (watts/meterxK) than isotropic metal, but this thermal conductivity has a preferred direction that is in the direction of the fibers embedded in the composite material.

The composite materials comprises a composite matrix and conductive fibers. The fibers include carbon fibers, preferably graphite fibers. The fibers are either arranged in cross-ply manner or are woven. The fibers are preferably graphite fibers, such as high modulus graphite fibers. The heat treatment of the high modulus fibers increases the thermal conductivity of the fibers, as is know to those in the art. One advantage of the low modulus fiber is that the fiber is relatively flexible. These fibers may be easily woven to the desired structures, as taught herein. As described above the fibers are arranged in cross-ply or woven manners. The fibers may also be braided. In one embodiment, the braid is made with a fiber pattern of 1:8:1.

The matrix may be any material which is capable of supporting the conductive fibers and which is able to satisfy the mechanical, thermal, and electrical properties required for the structure or enclosure in which the composite material is to be used. The composite matrix may be materials selected from the group consisting of carbon, ceramic, metal/metal alloy, polymer, or mixtures thereof. For instance, the composite matrix may be a carbon matrix which is supplied as a pyrolyzable source of carbon. The carbon matrix is introduced to a conductive fiber preform by chemical vapor infiltration (CVI) or by pitch impregnation. The carbon matrix comprises CVI carbon, a pyrolyzable carbon source, such as methane or pitch, or mixtures thereof. The carbon matrix and the conductive fiber are then heated to form composite which have a carbon matrix and conductive fibers, typically graphite fibers.

The matrix may also be ceramic. The ceramic matrix may be formed by any useful ceramic material or mixture, preferably the ceramic has some thermal conductivity properties. Examples of ceramic materials which may be used to form the ceramic composite, include silicon carbide, boron carbide, alumina, silicon nitride, boron nitride, aluminum nitride, etc.

In another embodiment, the composite matrix is a metal or metal alloy matrix. The matrix is formed from any metal or mixture of metals such as aluminum, copper, magnesium, etc. Examples of preferred composite materials are those prepared from graphite fibers and copper, aluminum 6061, 6101, and 6063, including anodized version of the aluminum.

In another embodiment, the composite matrix is a polymer matrix. Typically the polymer matrix is a thermoplastic or thermosetting resin. Examples of thermosetting and thermoplastic resins include polyamides (Nylon), polyesters, phenolic resins, polyvinylacetate resins, polyolefins, such as polyethylenes, polypropylenes, or ABS copolymers (e.g. styrene and butadiene or isoprene copolymers), polyvinyl esters, polyurethanes, polyacrylates, polycarbonates, polyetherimides, bismaleimides, silicon resins, epoxy resins and mixtures of two or more thereof. Preferably, the composite materials are polymer graphite matrix and fiber composite such as graphite/epoxy composites, graphite/bismaleimide composites, or graphite/polyetherimide composites. The composites may be formed from commercially available prepregs, such as epoxy/graphite composites formed from a Fiberite™ graphite/epoxy prepreg available from ICI, that includes fibers available from Hercules Corporation.

In one embodiment, the composite matrix is doped with a thermally conductive material. Examples of these thermally conductive materials include powders of silver, graphite, and diamond. The thermally conductive materials are added in an amount from about 0.5% up to about 10% by weight of the composite matrix.

With reference to FIG. 1A, the walls of the enclosure 10 are formed in a multiple layer arrangement in which there are first and second graphite resin skins 26,28 with a core sandwiched therebetween. In the embodiment described herein, the skins 26,28 are formed of a plurality of stacked laminates 32. Each laminate 32 is a low cost intermediate modulus graphite fiber impregnated with resin, such as a Fiberite™ graphite/epoxy prepreg available from ICI, that includes fibers available from Hercules Corporation. A graphite/epoxy prepreg is only one example, of course. The invention can be used with many different composite matrices, such as thermoset and thermoplastic resin materials, as well as different types of fiber materials, as is described above. In this case, for example, each composite laminate can be made from a low cost graphite/epoxy prepreg, syntactic or non-structural foams. The core is made, for example, from a glass bead epoxy syntactic, such as, for example, 3M Scotch-Core™. The use of the core provides increased stiffness for the wall with minimal increase in the overall weight. The glass bead epoxy core also provides an impedance mismatch that improves the EMI shielding of the walls.

As shown in FIG. 1A, the outer surfaces of the graphite resin skins include a layer 34 of conductive fibers. These fibers are co-consolidated with the epoxy of the laminates 32, and provide the primary EMI shielding for the enclosure 10. In another embodiment, the outer surfaces of the graphite resins skins is covered with a layer of EMI shielding metal. In one aspect the layer of metal comprises a layer of copper metal on the graphite resin skins with a layer of nickel metal over the layer of copper. Typically, the copper layer has a diameter from about 0.25 mil up to about 0.5 mil. The nickel layer typically has a diameter from about 0.25 mil up to about 0.7 mil. In one aspect, the nickel is a high phosphate nickel, such as those having from about 9% to about 12% phosphate.

According to an important aspect of the invention, the enclosure is preferably a unibody construction except for the access opening covers. By using a unibody construction, seal joints at the corners of the enclosure can be eliminated, thus substantially improving the structural strength of the enclosure as well as improving the EMI shielding by minimizing the number of apertures. In order to make a unibody enclosure, of course, the composite material will be laid up in a suitable mold, such as, for example, as used in an autoclave molding process. In order to be able to remove the enclosure from the mold after cure, one of the walls 12 is molded without any flanges, lips or stiffening members so that the molding elements can be removed after cure. If desired, a pair of stiffening members 36 may be attached to the unibody enclosure on preferably only a single wall in order to complete and strengthen the enclosure. Other stiffening members used in the enclosure can be integrally formed with the walls during the molding process. As shown in FIG. 1B, the stiffening members are made of an ultra light weight closed cell foam core, such as Divinycell™ and include a multiple laminate skin 26' that encloses the core material 30A.

The composite walls 12 can be made up by the following process. An autoclave mold is made in a conventional manner with the desired configuration for the enclosure 10. A layer of woven conductive carbon fiber is placed in the mold first, then a series of carbon/epoxy laminates are placed in the mold, followed by the uncured core material. Then another series of laminates are placed over the core, and if desired another layer of conductive fibers. A single cure can then be performed so that the conductive layers, laminates and core are co-consolidated to form the enclosure walls in a unibody configuration.

FIG. 2 shows a more complete view of the card guide as it can typically be used to hold electronic modules inside the enclosure 10. As described hereinbefore, the card guide includes a series of guide ribs 20 integrally formed with a cold wall 22. A heat exchanger 40, such as a series of cooling fins is attached to the outside surface of the cold wall 22 in the plenum 24 formed in or by a wall 12 of the enclosure 10. A circuit board CB with electronic components thereon (not shown), is mounted on a thermal plane T. A clamping device 42, such as, for example, a wedging device as described in U.S. Pat. No. 4,775,260 issued to Kecmer, is used to securely hold the thermal plane, in the channel 44 defined by adjacent ribs 20, up against one of the ribs. As represented by the arrows A, B and C in FIG. 2, in accordance with an important aspect of the present invention, the card guide is arranged in such a manner that the preferred direction of heat flow through the composite material of the card guide, and particularly through the ribs and cold wall, facilitates the transfer of heat from the thermal plane to the heat exchanger. This can be accomplished by using laminated structures for the ribs and cold wall wherein the fiber orientation, for example, is a cross-ply pattern as shown in FIG. 2 so that preferred direction of heat flow exists with respect to the plane that the thermal plane lies in. This promotes the transfer of heat towards the cold wall and heat exchanger without sacrificing structural performance. By providing a preferred direction for heat flow to the heat exchanger, the composite card guide exhibits a substantially increased heat transfer capacity compared to a conventional metal card guide. Depending on the type of clamping device 42 used, heat transfer can also occur through the clamping device to the cold wall 22.

As described above, the invention also relates to a composite cold wall. The cold wall acts to transfer heat from the thermal plane to a heat exchange means, such as cooling fins. The cold wall is composed of a composite with a matrix and fibers, as described above. The fibers are generally present in an amount from about 40% up to about 80%, more preferably from about 50% up to about 70% by volume. The fibers are arranged in a cross-ply pattern where a majority of the fibers are in the direction of heat flow. The fibers generally have a reference angle to the thermal plane from about 30° up to about 45°, preferably from about 35° to about 40°. A particularly useful angle is 37° to the thermal plane. In one embodiment, from about 60% to about 90%, preferably from about 75% to about 85%, more preferably about 80% of the fibers are arranged in the direction of heat flow. The other fibers are arranged perpendicular to the majority of the fibers to provide structural support for the cold wall and card guide ribs.

With reference to FIGS. 3A through 3E, the composite card guide 16, including the guide ribs 20 and the cold wall 22, can be formed by a method of building up layers of carbon resin laminates and arranging them in a desired manner for optimal heat flow. To obtain maximum performance from the fiber, a higher ratio of fibers is preferred (e.g., 2:1, 3:1, or 4:1) in the direction of the thermal plane, T, as partially depicted in FIG. 2 for clarity. FIGS. 3A–3E show one method while FIG. 4 shows another, but these are but two examples and should not be construed in a limiting sense. The particular method selected for a particular application will depend on the types of materials used, the flow direction needed to the heat exchanger and other factors such as cost constraints and so on.

In accordance with an important aspect of the present invention, first, carbon fibers are woven into a fabric having, for example, an unbalanced (2:1, 3:1, or 4:1) pattern with respect to the horizontal direction of the laminates as the laminates are stacked. The graphite fibers can be low thermal conductivity, low modulus graphite fibers, such as woven mesophase, pitch based yarn available from Amoco. This fiber material is a low modulus and strength fiber that is thus easy to weave and braid into a desired fabric orientation, but the thermal conductivity of the fibers is relatively poor due to graphite molecular alignment. After the fibers are woven into a fabric, the fabric is heat treated in accordance with the manufacturer's specifications and available literature. This heat treatment causes a dramatic increase in the thermal conductivity of the fibers, due in part to the fact that the heat treatment can cause higher molecular order. Therefore, what is left is a woven fabric that has excellent heat transfer capabilities. This initial process is very cost effective because the low grade graphite fiber is relatively inexpensive compared to high thermal conductivity fiber material. Moreover, the more expensive fiber material is more difficult to weave due to its stiffness.

An uncured resin layer, which may be, for example, a resin such as used for the enclosure walls 12 previously described herein, is then applied to the woven fabric such as with a hand layup method to form a prepreg. The resin layer impregnates the fabric before or during the curing step in which heat and pressure are applied to the composite material. Several of these laminate layers are stacked as shown in FIG. 3A by hand layup to form a block of material 50. Note that in this case the cross-ply fiber arrangement lies in horizontal planes parallel with the laminate stack.

Figure 3B:
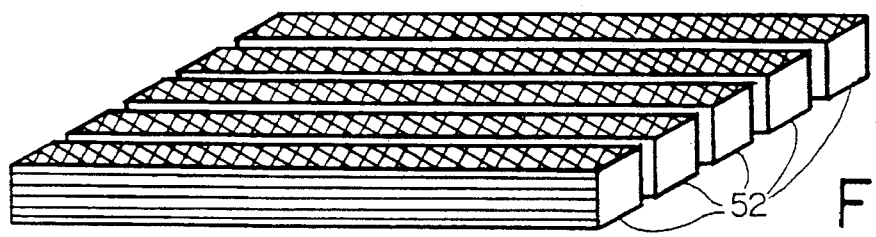
Figure 3C:
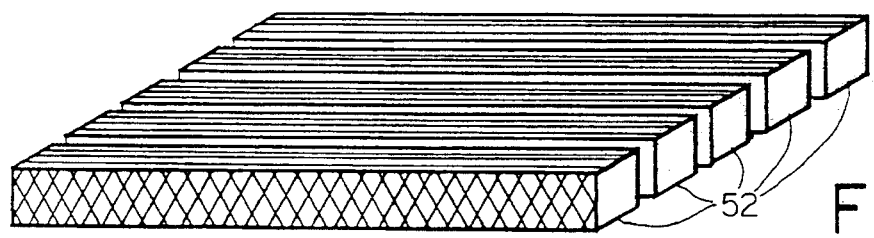
Figure 3D:
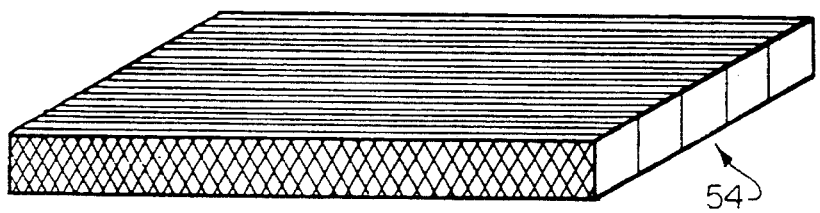
Figure 3E:
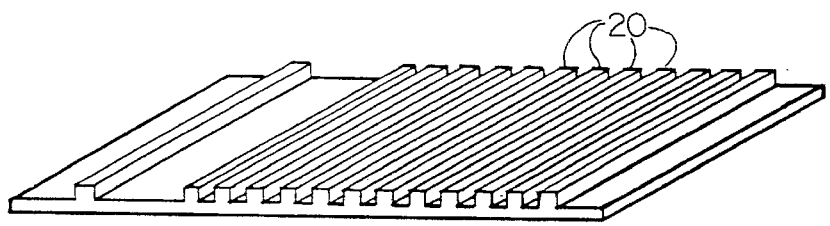
Figure 4:
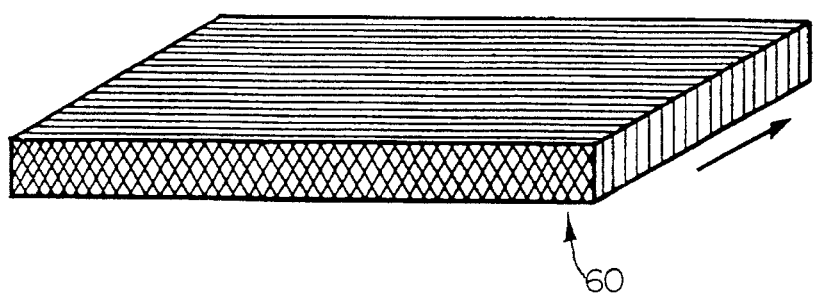
FIG. 4 illustrates part of another method for making a composite card guide according to the present invention.

In the step illustrated in FIG. 3B, the composite block is cut onto a plurality of segments 52 as illustrated. The cutting can be done in a conventional manner such as by diamond wheel cutting. Next, the segments are rotated as in FIG. 3C so that the cross-ply pattern now lies in the vertical planes. The rotated segments 52 are next bonded together and cured to secure the segments together to form a second block, as shown in FIG. 3D. Finally, the re-formed block 54 is cut by a suitable process such as described before, to form the guide ribs 20 integral with the cold wall. Thus, heat transfer can be facilitated away from the thermal plane of the circuit boards down to the cold wall and the attached heat exchanger 40 in an efficient manner.

The ribs 20 and cold wall 22 preferably are plated with a layer of metal (23), such as nickel by conventional process. The plating is only needed at the interfaces between the metal thermal planes T and the composite materials of the ribs and cold wall if they have the potential to develop galvanic corrosion. The plating also facilitates the attachment of the heat exchanger to the bottom of the cold wall in an efficient manner.

Different methods, of course, can be used to make the card guide. In FIG. 4, the laminates are stacked by hand layup such that the stacking is done in a horizontal plane and the cross-ply fiber orientation is initially in a vertical direction. The cured block 60 can then be machined to form the integral guide rib/coldwall structure. This alternative method thus saves the need to rotate and then bond the segments together and thus can be more cost effective.

The composite card guide can thus made as a unibody part. For example, the composite block 60 shown in FIG. 4 is made with sufficient vertical height to provide both the cold wall and guide ribs. The block thus can be precision machined and plated to form a single piece card guide.

Figure 5:
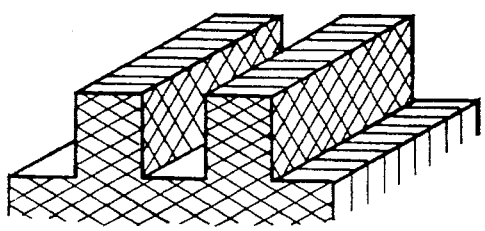
FIG. 5 is an illustration of a unibody composite card guide according to the invention.

In another alternative process for making the card guide, the fiber is braided to net shape (ribs and cold wall) and heat treated. The heat treated net shape is then to impregnated with resin, using a resin transfer molding (RTM) process. To obtain maximum performance from the fiber, a higher ratio of fibers is preferred (e.g., 2:1, 3:1, or 4:1) in the direction of the thermal plane, T, as previously described with reference to FIG. 2. The resultant card guide so produced can then be machined as needed to produce the desired final card guide configuration such as shown in FIG. 5.

Figure 6:
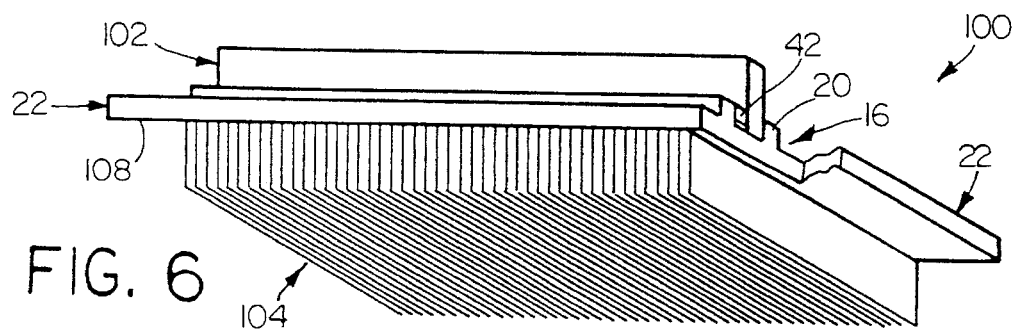
FIG. 6 illustrates a heat transfer system or structure in accordance with the invention.

With reference next to FIG. 6, a heat transfer system 100 is illustrated in perspective. Many of the elements of the system 100 are similar to the embodiment of FIG. 2, and like reference numerals are used for convenience. In accordance with this embodiment of the invention, the heat transfer system 100 is used to improve the heat dissipation in an enclosure, such as for example the composite enclosure of FIG. 1. Although the embodiments described herein relate to the use of an enclosure made of composite materials, those skilled in the art will readily appreciate that the heat transfer structure 100 can be used in other enclosures, including non-composite enclosures. Furthermore, the system 100 can be used in heat dissipation applications other than within an enclosure.

The system 100 includes a thermal plane 102 (partially shown), the lower extremity of which is clamped against one of the ribs 20 of a cold wall 22. A clamping device 42 securely holds the thermal plane against a face of the adjoined rib 20. As described hereinafter, the thermal plane 102 is made of composite materials to significantly improve the heat transfer characteristics thereof.

The cold wall 22 and ribs 20 form a card guide made of composite materials, such as described herein. Attached to the card guide 16, and more specifically to an outer surface of the cold wall 22 is a series of cooling fins 104. According to one aspect of the invention, the cooling fins are made of composite materials including a matrix and thermally conductive fibers. The matrix and the thermally conductive fibers are described above. The fin typically has a fiber volume sufficient to transfer heat as required. Preferably the fins have at least about 65%, or preferably about 70% by volume fibers. These fins may be any thickness which provides beneficial thermal transfer properties. Typically the fins have a diameter from about 4 to about 25 mil, preferably from about 5 to about 12, more preferably about 5 to about 9 mils. As with the design of FIG. 2, the cooling fins 102 can extend into a plenum or other suitable passageway (or can simply be exposed to ambient atmosphere or the inner volume of an enclosure, to name other examples) through which passes or flows a heat transfer medium. This medium could be air, for example, for a convective heat transfer. Alternatively, the cooling fins can be attached or in thermal contact with a conductive heat transfer medium such as a heat sink, thermomodules and so forth.

In another embodiment, the fins are metal fins, preferably aluminum fins. These fins may be prepared by machining a block of aluminum to form the fins. The fins may be separate plate-like fins or may be of unibody design with an aluminum base block with fins extending from the block. The fins may be attached with thermally conductive paste as described herein. In another aspect, the cold wall has a layer of metal, such as nickel, between the fins and the cold wall.

The card guide and fins, viewed as a complete assembly, serve as an all composite heat transfer structure between the thermal plane (and the heat source(s) therewith) and the heat transfer medium. The all composite heat transfer assembly can be used in hybrid configurations with conventional metal thermal planes, or with thermal plane constructions in accordance with the invention herein.

The thermal plane typically will be part of or integral with an electronic module, such as a circuit board for example, on which are mounted or otherwise disposed a number of electronic components that generate heat. The thermal plane may be any thermal plane which transmits heat well from electrical components. The thermal planes may be metallic, ceramic or composite. Examples of thermal planes include those prepared from aluminum, copper, beryllium, molybdenum, tungsten, silicon, beryllia, aluminum nitride, fiberglass-epoxy composite, silicon carbide, alumina, gallium arsenide, and carbon/carbon composites.

In one embodiment, the carbon-carbon composites are prepared by densifying a carbon fiber preform with a carbon matrix. The density of the densified carbon composite is from about 0.75 to about 2.0, or from about 1.0 to about 1.9, or from about 1.1 to about 1.8 g/cc. The densified carbon-carbon composite is heated to graphitize the carbon. The graphitization improves the thermal conductivity of the carbon composite. The temperature is typically from about 2000° C. to about 4000° C., or from about 2300° C. to about 3500° C., or from about 2500° C. to about 3100° C. The graphitization typically is accomplished in about 0.5 to about 5 hours. As described above, the carbon-carbon composites are prepared by densifying a carbon fiber preform with a carbon matrix. The carbon fiber preform may be prepared from any fiber which may form carbon or graphite upon heating. The fibers include PAN (polyacrylonitrile) fibers, pre-oxidized acrylonitrile resin fibers, pitch fibers, CVD carbon fibers, pyrolyzed natural fibers, such as pyrolyzed cotton fibers, and mixtures thereof. The fibers are arranged to form the carbon fiber preform in a manner known to those in the art. The preforms may be woven or nonwoven. The preforms may be formed from braided fibers, typically straight braided fibers. Braided fibers are described in U.S. Pat. No. 5,217,770, issued to Morris, Jr, et al. The carbon fiber preform may be 1 D (one dimensional), 2 D (two dimensional), needled 2 D , or 3 D (three dimensional).

The carbon fiber preform is densified in the presence of a carbon matrix. The carbon matrix supplies a source of carbon which may be converted to graphite. The carbon matrix is introduced to the carbon fiber preform by chemical vapor infiltration (CVI) or by pitch impregnation. The carbon matrix comprises CVI carbon, a pyrolyzable carbon source, such as methane or pitch, or mixtures thereof.

In one embodiment, the carbon-carbon composites are prepared by partially densifying a carbon fiber preform with a carbon matrix and then infiltrating the densified carbon composite with a material capable of increasing the thermal coefficient of thermal expansion of the densified carbon composite. The partially densified carbon composite is thereafter infiltrated with one or more materials capable of increasing the coefficient of thermal expansion of the densified carbon composites. The material fills the voids in the carbon composite. Preferably the voids are interconnected.

The materials which improve the coefficient of thermal expansion are generally present in an amount from about 5% up to about 60%, or from about 7% up to about 40%, or from about 10% up to about 25% by volume. One advantage of the present method is that if the coefficient of thermal expansion between the carbon-carbon composites and the electronic substrate and electronic devices are equal or nearly equal, then solder may be used to attach the components. The matching of the coefficient of thermal expansion reduces thermal stress and provides reliable electronic devices. Solder is beneficial because it has improved thermal conductive properties.

The materials include at least one polymer, ceramic, or metal. The polymers include epoxy polymers, polyimides, isocyanate esters and other thermoset and thermoplastic polymers capable of increasing the coefficient of thermal expansion. The ceramics which are useful include alumina, aluminum nitride, silicon carbide, silicon nitride, boron carbide, boron nitride, and mixtures thereof and ceramic precursors, such as polycarbosilane. For example, a carbon composite may be infiltrated with silicon carbide by CVI.

In one embodiment, the materials capable of raising the coefficient of thermal expansion of the densified carbon composite include metals and metal alloys. Specific examples include, aluminum, aluminum silicon (40%), copper, copper and tungsten (40% copper) alloy, copper molybdenum (15%) alloy, molybdenum, silver, nickel, and iron and tungsten. In one embodiment, the metals include aluminum, copper, silver and mixtures and alloys thereof. For example, the metal or metal alloys may be infiltrated into a carbon deposit by first pulling a vacuum on the carbon composite and degassing the composite. The metal or metal alloy is then heated to at or near its melting point and infiltrated into the carbon composite under pressure.

The following examples relate to above carbon-carbon composites. Unless otherwise indicated here as well as elsewhere in the specification and claims, the weight and ratios are by volume, the temperature is in degrees Celsius and the pressure is atmospheric.

A needled PAN fiber carbon preforms were processed by CVD to the densities given below, and then heat treated to 3000° C. until the carbon matrix was graphitized. The densified carbon composites were infiltrated with either aluminum or copper by a process, which is believed to be pressure infiltration, of Amercom Inc. of Chatsworth, Calif.

TABLE 1

| Properties of Aluminum Impregnated Composites | | | | |
|---|---|---|---|---|
| | C—C Density gm/cc | Final Density gm/cc | | C—C Density gm/cc | Final Density gm/cc |
| Al-1 | 0.97 | 2.30 | Cu-1 | 0.97 | 5.11 |
| Al-2 | 1.47 | 2.23 | Cu-2 | 1.47 | 4.33 |
| Al-3 | 1.49 | 2.18 | Cu-3 | 1.49 | 3.58 |
| Al-4 | 1.52 | 2.17 | Cu-4 | 1.53 | 3.13 |

Although a conventional metal thermal plane, such as one made of aluminum, exhibits good heat conduction, heat transfer efficiency can be improved, while at the same time substantially reducing the weight of the module, by the use of composite materials for the thermal plane 102.

A complete all composite heat transfer system (FIG. 6) then, can include the thermal plane 102 (or any number thereof), the card guide 16 including the ribs and cold wall, and the fins 104. In accordance with the invention, all these assemblies are preferably made of composite materials including the use of high thermal conductivity fibers. The thermal plane is disposed in good thermal contact with the guide rib and cold wall, which are further in good thermal contact with the fins. In this manner, heat can be efficiently conducted from the heat source, such as electrical components, to the thermal transfer medium. Because each of the thermal transfer elements (thermal plane, card guide and fins) has a preferred heat flow direction, it is important that these structures be joined together to avoid introducing high thermal resistance interfaces. Thus, one advantageous feature will be to align the conductive fibers in generally parallel relationship at each interface between two elements with reduced material discontinuity. The use of thermally conductive adhesives can further improve the heat transfer between adjoined elements. Another advantageous feature is to reduce the presence of the matrix material, such as the resin matrix, in the thermal path. This is because the matrix itself, as distinguished from the thermally conductive fibers, is a thermal insulator.

In accordance with the invention, fin 104 is also made of composite materials including a matrix with thermally conductive fibers. The fin can be a laminated structure, and as illustrated in FIGS. 7A–7D, preferably has the conductive fibers oriented in a generally unidirectional manner in the direction of preferred heat flow (in FIGS. 7A–D this direction is generally vertical as viewed in the drawing). The unidirectional fiber orientation can be used for the fins because typically the fins will not be load bearing structures (which also allows the presence of microvoids in the fin matrix without appreciably structural compromise). This lower structural requirement also permits a very high fiber loading in the fins to increase the heat dissipation thereof as well as to minimize fiber material discontinuities. The fins can have fiber loading in excess of 80% by volume.

The direction of the fiber orientation in each fin should be generally parallel with the direction of maximum thermal conductivity of the card guide, and more specifically the cold wall, to which the fin is attached or otherwise integral therewith. A distinction should be noted between saying the fin fibers need to be generally parallel to the card guide fibers, and saying the fin fibers should be generally parallel with the direction of maximum thermal conductivity through the card guide cold wall. Heat transfer to the fins can be increased by having the fin fibers oriented parallel with the cold wall fibers for those applications that permit such an arrangement. The close parallel relationship will serve to maximize the heat transfer between the cold wall and the fins by reducing the presence of a thermal resistance path therebetween and maintaining the direction of heat flow through the structure.

It will be noted, however, that the cold wall fiber arrangement can include a weave or criss-cross pattern within each laminate, as in the embodiments described herein. This provides improved thermal transfer between the thermal plane and the card guide, as well as provides structural strength for the ribs and cold wall. But even in applications that use such a weave pattern, there is a direction of maximum heat transfer through the card guide and this direction will lie parallel to the respective "planes" of the laminates that contain the woven fibers. Thus the fin fibers can be oriented in a direction generally parallel to the direction of maximum heat transfer through the cold wall, such as by having the fin fibers generally parallel with the planes that the cold wall laminates lie in, even if this means that the fin fibers are not substantially parallel with the fiber orientation in the cold wall.

Figure 7A:
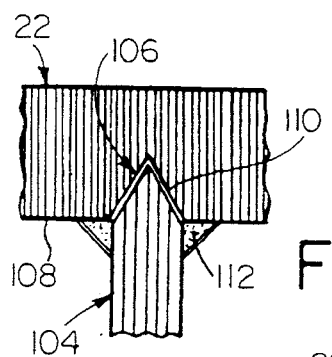
FIGS. 7A–7D illustrate alternative embodiments for attaching a composite cooling fin to a composite cold wall.
Figure 7C:
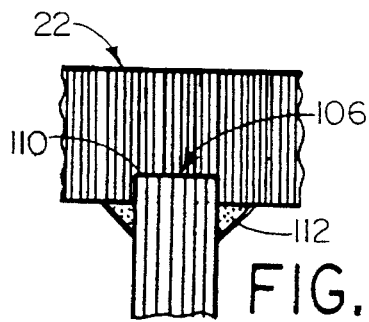
Figure 7B:
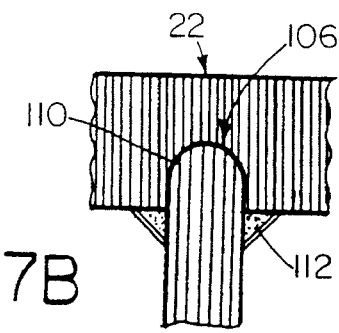

FIGS. 7A–7D illustrate various embodiments for attaching the fins to a composite cold wall. In the examples of FIGS. 7A–C, the fin 104 is formed as a thin plate with machined ends. The fin end proximate the cold wall to be attached thereto is machined to a contour adapted to conform to the profile of a slot or track 106 machined or otherwise formed (such as for example in a mold) into the outer surface 108 of the cold wall. In FIG. 7A, the fin end attached to the cold wall is machined to form fit in a V-shaped slot; in FIG. 7B the slot has a rounded profile; and in FIG. 7C the slot has a rectangular profile. In FIG. 7A, the angle for optimal thermal transfer will depend in part on the card guide thickness and the deflection of the card guide under stress. The design of FIG. 7B avoids high stress concentrations, while the design of FIG. 7C often will be the easiest and most cost-effective to implement. These are, of course, just three examples of different mated joint arrangements that can be used for attaching the fins to the cold wall.

In all three examples, the machined fin end can be inserted into the slot 106 to provide intimate contact between the fin and the cold wall, including close positioning of the fin fibers with the cold wall fibers to minimize fiber material discontinuities. Prior to installation, the fin ends are further treated with a thermally conductive paste 110, such as, for example, a highly loaded (e.g. >70%) pyrolytic graphite filled, silver filled, or diamond filled epoxy. This paste improves the thermal coupling between the fin and cold wall, and particularly provides a high thermally conductive path between the cold wall fibers and the fin fibers at the structural interface thereof.

It will be noted that the juncture of the fin and the cold wall, within the slot 106, is an area where high thermal transfer efficiency is needed. Structural support for the fin can, optionally, be provided outside this area by the use of a structural adhesive fillet 112 at the outer joint between the fin and the cold wall, which typically is an area of reduced thermal coupling between the fin and the cold wall anyway and will not be present in the thermal path.

Figure 7D:
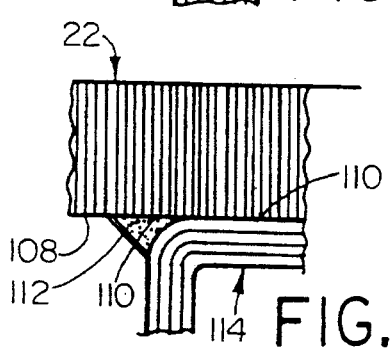

In the embodiment of FIG. 7D, the fin segments consist of a onepiece corrugated structure which is split along the axis to form fin segments. Each fin segment 114 is then mounted on the cold wall surface 108 with a thermally conductive paste 110. The paste can be disposed along the interface between the cold wall surface 108 and the fin extension 114, as well as in the form of a fillet at the corners thereof, as illustrated in FIG. 7D. A structural adhesive 112 can then be applied for structural rigidity.

Figure 8A:
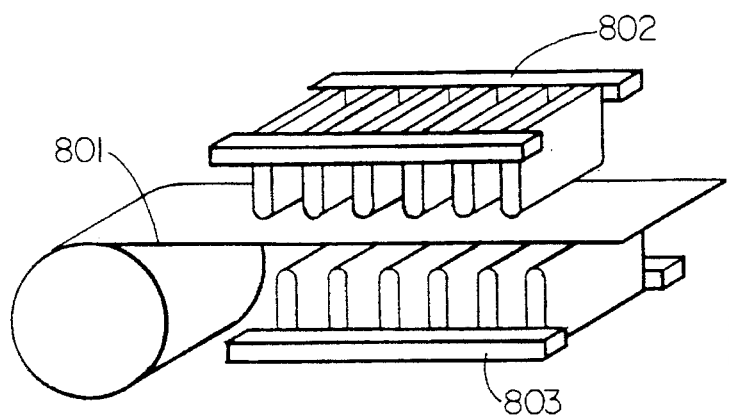
FIG. 8A–8B illustrates a method of preparing a corrugated composite shape.
Figure 8B:
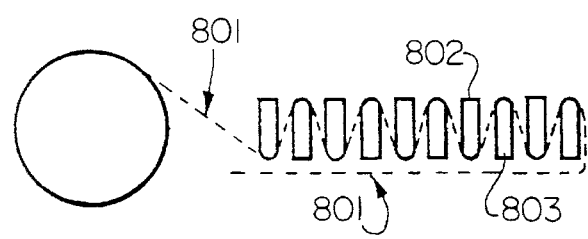
Figure 9:
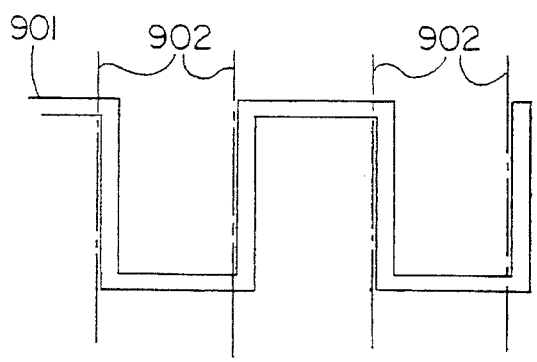
FIG. 9 illustrates a method of preparing fins.

The fins shown in FIG. 7D may be prepared by placing the fibers in a mold containing the desired shape to form fins and then adding composite matrix and forming the composite material. In one aspect, as shown in FIG. 8A, composite prepreg (801) is placed between upper forming die (802) and lower forming die (803). The dies are pressed together and the prepreg is cured to form a corrugated composite shape, as shown n FIG. 8B. As shown in FIG. 9, the fins are prepared by taking the corrugated composite shape (901) and cutting along its vertical axis, e.g. lines (902), to form a "L" shaped fins which may then be attached with a thermally conductive paste and, optionally, structural adhesive as described herein.

Figure 10:
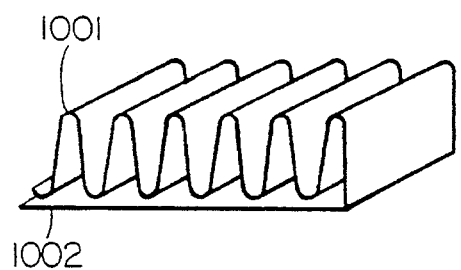
FIG. 10 illustrates a corrugated composite shape.

In the embodiment of FIG. 10, the fins may be a unibody corrugated composite shape which is attached to the cold wall. In this embodiment, the fins are attached with thermally conductive adhesive, as described herein, along ridges 1001. In one aspect, the corrugated composite shape is formed as described herein (FIG. 8A and B). As shown in FIG. 8B and 10, the composite prepreg may be wrapped back under the lower forming die and cured to form supporting member 1002.

Figure 11:
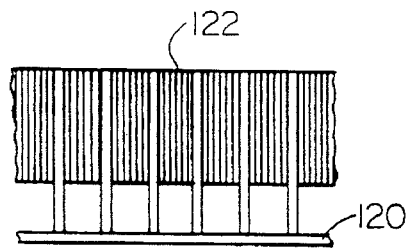
FIG. 11 illustrate another embodiment.

The embodiment of FIG. 11 incorporates a continuous fiber reinforced matrix design in which the thermally conductive fibers run continuous through the card guide and fin. This is referred to herein as an integral structure because the fins are structurally formed with the card guide, rather than separately attached. This embodiment is prepared by alternating two sizes laminating material, wherein the area of the shorter laminating material is filled with wax or salt. Following standard processing, the wax or salt is removed. Typically one size of the laminant is prepared from the composite cold wall material described above and the other size is prepared from the fin composite material descried herein. In another aspect, both laminating materials are prepared from the composite materials used for the cold walls. In another embodiment, wax or salt is not used and the longer laminating material is unsupported during processing. In this embodiment, the fin extends upward to avoid damage to the tins. Since the card guide laminates can be layed up in a conventional manner, the laminates that include the fm fibers can, be more heavily loaded with the fibers without significant effect on the overall structural integrity. To illustrate this embodiment, the integral fin/cold wall structure may be prepared by positioning fin material between blocks 52 in FIG. 3C, such that fin material extends generally transverse away from a surface of the blocks. The blocks and fin material are then bonded and cured to produce the structure as show in FIG. 11.

The design in FIG. 11 can offer a higher thermal transfer performance in many applications because it eliminates structural interfaces and other thermal resistance contacts otherwise possible at a fin/cold wall joint. The integral fin/cold wall embodiment also offers structural advantages over the nonintegrally formed fins previously described herein. Also illustrated in FIG. 11 is the use of a metal or composite plate 120 attached to the distal ends of the fins opposite the cold wall 22. This thin plate may be attached to the tim, such as with the use of a thermally conductive adhesive, and adds structural support to the fins as well as increasing the overall surface area for increased heat transfer. Plate 120 can be highly fiber loaded, with the fiber orientation thereof generally parallel to the direction of maximum heat transfer through the tim. The plate 120 can be similarly incorporated into the other embodiments of the invention described herein.

Figure 12:
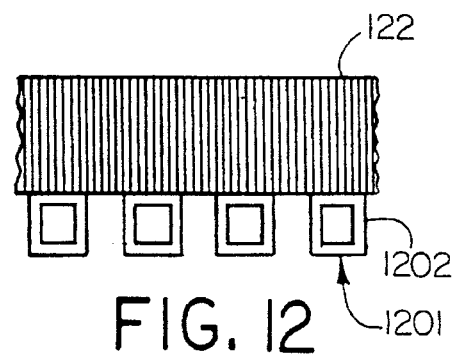
FIG. 12 illustrate an embodiment of the box cooling element.

As illustrated in FIG. 12, a cooling element is attached to the cold wall. In one aspect, the cooling element is a cooling block (1201) with fin like walls (1202). The cooling element may be prepared by placing composite prepreg around a mandrel, curing the composite too form a box composite shape, and removing the mandrel to reveal a box cooling member. Alternately, the cooling member may be formed by filament winding, where fiber is drawn through a composite matrix material, such as an epoxy resin, and then wound around .an mandrel. Multiple windings may be used to provide laminant layers. The resulting windings are then cured to form the cooling element of FIG. 12.

The invention thus provides an all composite heat transfer system and structure that reduces weight while increasing heat transfer efficiency. The all composite design eliminates galvanic interfaces thus eliminating the need for metallized protective layers, which simplifies overall processing requirements. However, the composite subassemblies, such as the cold wall/fin heat exchanger, can be used in hybrid systems to improve heat transfer in applications that still require the use of conventional thermal planes and/or enclosures.

While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

We claim:

1. A cold wall having a number of guide ribs thereon, wherein the cold wall and the guide ribs are a composite material comprising a matrix and conductive fibers, wherein the fibers are woven in a cross-ply manner with an unbalanced fiber ratio oriented in a direction to facilitate heat transfer through the guide rib and further through the cold wall.

2. The cold wall of claim 1 wherein the matrix is selected from the group consisting of a resin matrix, a metal matrix, a ceramic matrix, and a carbon matrix.

3. The cold wall of claim 1 wherein the matrix is a thermoset or thermoplastic resin matrix.

4. The cold wall of claim 1 wherein the matrix is an epoxy matrix.

5. The cold wall of claim 1 wherein the fibers comprise graphite fibers.

6. The cold wall of claim 1 wherein the fibers are woven graphite fibers.

7. The cold wall of claim 1 wherein at least about 60% of the fibers are oriented in a direction to facilitate heat transfer through the guide rib and further through the cold wall.

8. The cold wall of claim 1 further comprising heat exchanger attached to the cold wall for dissipating heat conducted from the guide ribs and cold wall.

9. The cold wall of claim 8 wherein the heat exchanger is an composite fin comprising a matrix and conductive fiber.

10. The cold wall of claim 8 wherein the heat exchanger is a box cooling element with fins.

11. A cold wall having a number of guide ribs thereon, wherein the cold wall and the guide ribs are a composite material comprising a thermoset of thermoplastic resin and conductive fibers, wherein the fibers are woven in a cross-ply manner with an unbalanced fiber ratio oriented in a direction to facilitate heat transfer through the guide rib and further through the cold wall.

12. The cold wall of claim 11 wherein the matrix is an epoxy matrix.

13. The cold wall of claim 11 wherein the fibers comprise graphite fibers.

14. The cold wall of claim 11 wherein the fibers are woven graphite fibers.

15. The cold wall of claim 11 wherein at least about 60% of the fibers are oriented in a direction to facilitate heat transfer through the guide rib and further through the cold wall.

16. The cold wall of claim 1 wherein the cold wall and guide ribs are laminated.

17. The cold wall of claim 1 wherein the fibers, oriented in the direction of heat flow, have a reference angle to the thermal plane from about 30° up to about 45°.

18. The cold wall of claim 1 wherein the fibers are generally present in an amount from about 40% up to about 80% by volume.

19. The cold wall of claim 1 wherein the cold wall and ribs are plated with a layer of metal.

20. A cold wall having a number of guide ribs thereon, wherein the cold wall and the guide ribs are composite material comprising a matrix and conductive fibers and a heat exchanger attached to the cold wall for dissipating heat conducted from the guide ribs and the cold wall.

21. The cold wall of claim 20 wherein the fibers are woven in a cross-ply manner with an unbalanced fiber ratio oriented in a direction to facilitate heat transfer through the guide rib and further through the cold wall.

22. The cold wall of claim 21 wherein at least about 60% of the fibers are oriented in a direction to facilitate heat transfer through the guide rib and further through the cold wall.

23. The cold wall of claim 20 wherein the heat exchanger is an composite fin comprising a matrix and conductive fiber.

24. The cold wall of claim 20 wherein the heat exchanger is a box cooling element with fins.

* * * * *